United States Patent
Lau et al.

(10) Patent No.: US 7,548,129 B2
(45) Date of Patent: Jun. 16, 2009

(54) ON-CHIP R-C TIME CONSTANT CALIBRATION

(75) Inventors: Wai Lau, Taipei Hsien (TW);
Chao-Wen Tseng, Hsin-Chu Hsien (TW); Wei-Chien Chiu, Tai-Nan (TW);
Ying-Chi Chen, Tai-Chung (TW)

(73) Assignee: Quantek, Inc., Sindian, Taipei Hsien (TW)

( * ) Notice: Subject to any disclaimer, the term of this patent is extended or adjusted under 35 U.S.C. 154(b) by 72 days.

(21) Appl. No.: 11/552,139

(22) Filed: Oct. 23, 2006

(65) Prior Publication Data

US 2007/0109063 A1    May 17, 2007

Related U.S. Application Data

(60) Provisional application No. 60/597,170, filed on Nov. 14, 2005.

(51) Int. Cl.
*H03K 3/02* (2006.01)
*H04B 1/10* (2006.01)
(52) U.S. Cl. .................... 331/143; 331/44; 327/553
(58) Field of Classification Search .......... 331/111, 331/143, 44; 327/182, 552, 553
See application file for complete search history.

(56) References Cited

U.S. PATENT DOCUMENTS

| 5,245,646 | A | 9/1993 | Jackson et al. | |
|---|---|---|---|---|
| 6,404,293 | B1 * | 6/2002 | Darabi et al. | 331/37 |
| 6,639,479 | B2 * | 10/2003 | Kappes et al. | 331/135 |
| 6,677,814 | B2 * | 1/2004 | Low et al. | 327/554 |
| 6,842,710 | B1 * | 1/2005 | Gehring et al. | 702/107 |
| 7,233,213 | B2 * | 6/2007 | Won | 331/143 |

* cited by examiner

*Primary Examiner*—Robert Pascal
*Assistant Examiner*—Levi Gannon
(74) *Attorney, Agent, or Firm*—Winston Hsu

(57) ABSTRACT

An integrated tuner includes circuitry to receive a television signal, a quadrature mixer coupled to the output of the circuitry, a polyphase filter coupled to the output of the quadrature mixer, a relaxation oscillator, and a digital calibration module. The relaxation oscillator generates a clock having a period that is directly proportional to the on-chip RC time constant. The clock is fed into a counter of the digital calibration module. The counter is started and stopped at predefined time intervals by a finite state machine. The finite state machine updates the calibration code based on a successive approximation algorithm according to the end count results received from the counter. The digital calibration module outputs the updated calibration code to the polyphase filter and to the relaxation oscillator.

4 Claims, 3 Drawing Sheets

ON-CHIP R-C TIME CONSTANT CALIBRATION

CROSS REFERENCE TO RELATED APPLICATIONS

The present application claims the benefit of priority from U.S. Provisional Patent Application No. 60/597,170, filed on Nov. 14, 2005, which is hereby incorporated by reference as if set forth in full in this document for all purposes.

BACKGROUND OF THE INVENTION

1. Field of the Invention

The present invention is related to an integrated tuner chip, and more specifically an integrated tuner chip having precision self-calibration of an RC time constant utilized by a polyphase filter for improved image rejection.

2. Description of the Prior Art

An integrated tuner chip typically uses a polyphase filter to combine the I/Q signals from a quadrature mixer to form an image rejection mixer. The image rejection performance of the overall structure highly depends on how well the RC time constant matches a desired value. However, a typical process has a resistance variation of about +/−20% while the capacitance may vary up to +/−10%. Obviously these variations make it difficult to have the RC time constant consistently match the desired value. A calibration of the RC time constant is therefore necessary for the polyphase filter.

One prior art RC time constant calibration approach disclosed in U.S. Pat. No. 5,245,646 issued to Jackson et al. uses a reference clock to count a pulse that depends on the RC time constant. A problem with this method is that the reference clock cannot be arbitrarily high in frequency and the digital counter itself has a limit. Greater flexibility and precision is desired in calibration of the RC time constant to improve image rejection characteristics of the integrated tuner chip.

SUMMARY OF THE INVENTION

It is therefore a primary objective of the present invention to disclose an integrated tuner that performs on-chip RC time constant calibration to solve the above-mentioned problems.

An integrated tuner includes circuitry to receive a television signal, a quadrature mixer coupled to the output of the circuitry, a polyphase filter coupled to the output of the quadrature mixer, a relaxation oscillator, and a digital calibration module. The relaxation oscillator generates a clock having a period that is directly proportional to the on-chip RC time constant. The clock is fed into a counter of the digital calibration module. The counter is started and stopped at predefined time intervals by an enable signal issued by a finite state machine also of the digital calibration module. The finite state machine updates the calibration code, rc_code, based on a successive approximation algorithm according to the end count results received from the counter. The digital calibration module outputs the updated rc_code to the polyphase filter and to the relaxation oscillator.

One example successive approximation algorithm first sets the calibration code rc_code to a middle value. The counter is then started and stopped in order to count periods in the output of the relaxation oscillator, and the end count is compared by the finite state machine to a desired value and updates one bit of the rc_code accordingly until all bits of the rc_code have been set.

The relaxation oscillator has two half circuits with each half circuit having a bandgap over on-chip resistor current to charge a capacitor bank with the number of capacitors in the capacitor bank currently on-line controlled by the rc_code. When the voltage reaches a reference voltage, a comparator output toggles an SR-latch, shuts off the original half circuit, and enables the other half circuit. Hence, the output of the relaxation oscillator has a time period directly proportional to the on-chip RC time constant.

By using proper types of resistors and capacitors, variation does not depend heavily on temperature and voltage, and is mainly process dependent. Therefore, it is possible to do only one calibration at startup so a long calibration time is not an issue. The resulting higher precision ensures that image rejection is only limited by resolution of the polyphase filter, rather than calibration.

These and other objectives of the present invention will no doubt become obvious to those of ordinary skill in the art after reading the following detailed description of the preferred embodiment that is illustrated in the various figures and drawings.

DETAILED DESCRIPTION

As previously described, U.S. Pat. No. 5,245,646 uses a reference clock to count a pulse that depends on an RC time constant. In contrast, the present invention creates a clock that depends on an RC time constant to count a pulse that is based on the reference clock. A major difference between the two calibration approaches is that the present invention can have the pulse arbitrarily long by continuously dividing the reference clock down. In other words, swift calibration time can be traded for increased precision without any limit and can measure a pulse width to any desired precision and ultimately resulting in obtaining better image rejection characteristics.

Figure 1:
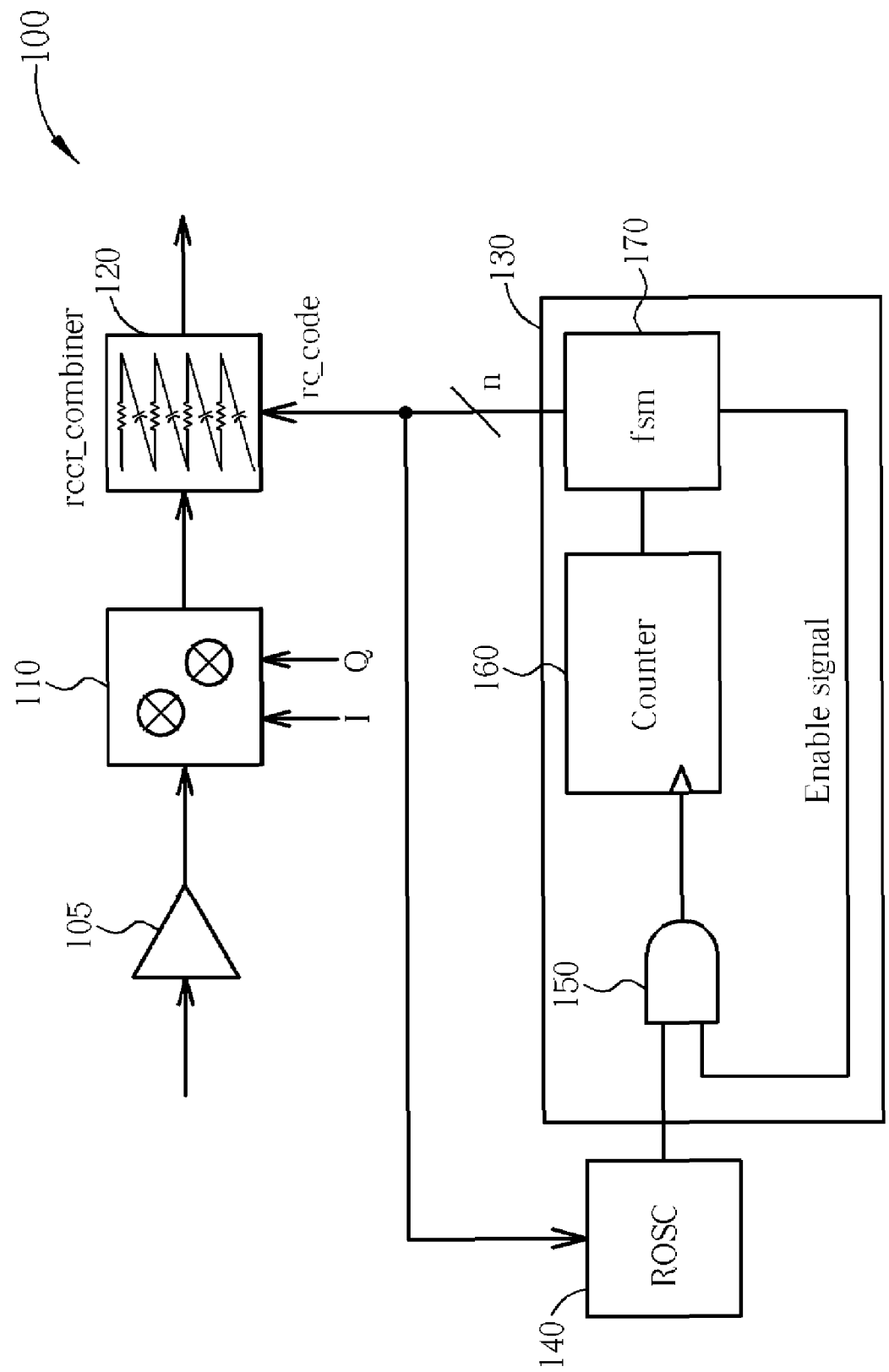
FIG. 1 is a functional block diagram of an integrated tuner according to the present invention.

FIG. 1 shows an integrated tuner 100 that performs on-chip RC time constant calibration according to the present invention. The integrated tuner 100 comprises circuitry 105 to receive a television signal, a quadrature mixer 110 coupled to the output of the circuitry 105, and a polyphase filter rccr_combiner 120 coupled to the output of the quadrature mixer 110 to combine the I/Q signals from the quadrature mixer 110 to form an image rejection mixer and output the desired image. The rccr_combiner 120 comprises a plurality of resistors and capacitors as is known in the art. To avoid distortion in the outputted image, the rccr_combiner 120 includes an input for receiving an rc_code (on-chip RC time constant) for calibration of the rccr_combiner 120.

The integrated tuner 100 further comprises a relaxation oscillator 140 and a digital calibration module 130. The digital calibration module 130 comprises an AND gate 150, a counter 160, and a finite state machine 170 and calibrates and outputs the rc_code to the rccr_combiner 120 and to the relaxation oscillator 140. The relaxation oscillator 140 may alter frequency according to the received rc_code and outputs a clock having the new frequency to the digital calibration module 130, where the rc_code may again be changed according to the situation.

The relaxation oscillator 140 generates the clock, the period of which is directly proportional to the on-chip RC time constant rc_code. The clock is fed into a first input of a two input AND gate 150 of the digital calibration module 130 and the output of the AND gate 150 is fed into the counter 160. The counter 160 is started and stopped at predefined time intervals by an enable signal issued by the finite state machine 170 and fed into the second input of the AND gate 150. The finite state machine 170 updates the calibration code, rc_code, which is used in both the relaxation oscillator 140 and the rccr_combiner 120 based on a successive approximation algorithm according to the end count results received from the counter 160.

Figure 2:
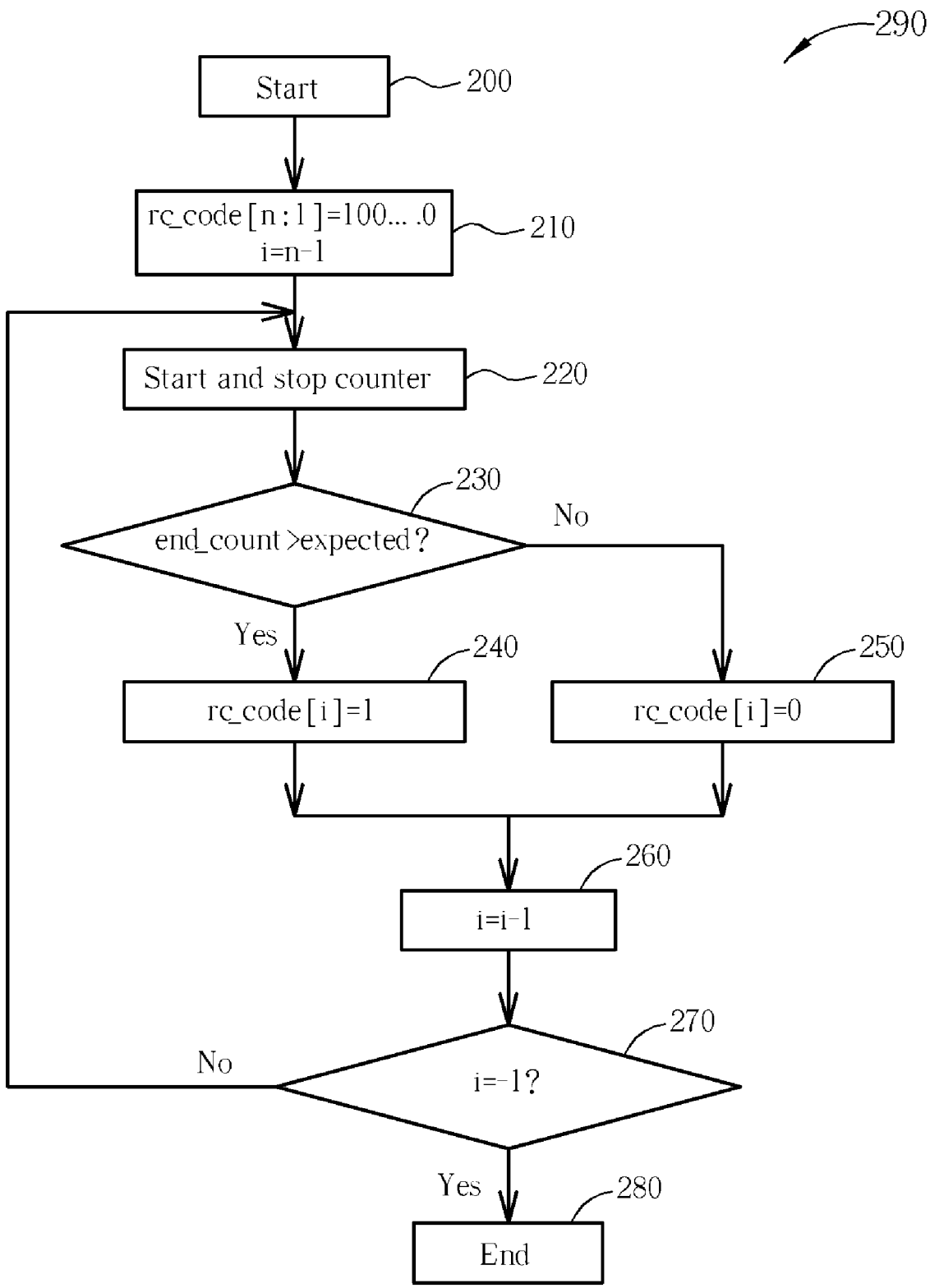
FIG. 2 shows a flow diagram for one example successive approximation algorithm used by one embodiment of the present invention.

FIG. 2 shows a flow diagram for one example successive approximation algorithm 290. The calibration code rc_code is first set to a middle value. The counter 160 in the calibration block 130 is then started and stopped in order to count periods in the output of the relaxation oscillator 140, and the FSM 170 compares the end count to a desired value. If the end count is too high, the relaxation oscillator 140 frequency is too high, thus one bit of the rc_code is updated to increase the RC time constant. If the end count is too low, the relaxation oscillator 140 frequency is too low, thus one bit of the rc_code is updated to decrease the RC time constant. The same procedure is applied for each bit of the rc_code until all bits of the rc_code have been set in the order from the most significant bit to the least significant bit of the rc_code.

The successive approximation algorithm 290 comprises the following steps.

Step 200: Start.

Step 210: Initialize the rc_code to a middle value, which means that the most significant bit is equal to "1" and all lesser significant bits of the rc_code are equal to "0". Set a variable "i" equal to n−1, where n is an index value of the most significant bit.

Step 220: The FSM 170 asserts the enable signal to the counter 160. After a predetermined amount of time, the FSM 170 de-asserts the enable signal to stop the counter 160.

Step 230: The FSM 170 then compares the number periods counted by the counter 160 with a desired value. If the count is greater than desired, go to Step 240, else go to Step 250.

Step 240: The rc_code is increased by the FSM 170 to lower the frequency of the relaxation oscillator 140 by setting bit "i" of the rc_code equal to "1". Go to Step 260.

Step 250: The rc_code is decreased by the FSM 170 to raise the frequency of the relaxation oscillator 140 by setting bit "i" of the rc_code equal to "0".

Step 260: Decrement "i".

Step 270: If "i" is not equal to "−1", meaning that if all bits in the rc_code have not yet been set, go to Step 220.

Step 280: Stop.

Variations of the algorithm 290 such as omitting step 250 because the bits we already initialized to "0" in step 210, or in step 210, only initializing the most significant bit etc. are intended to fall within the scope of the present invention.

Figure 3:
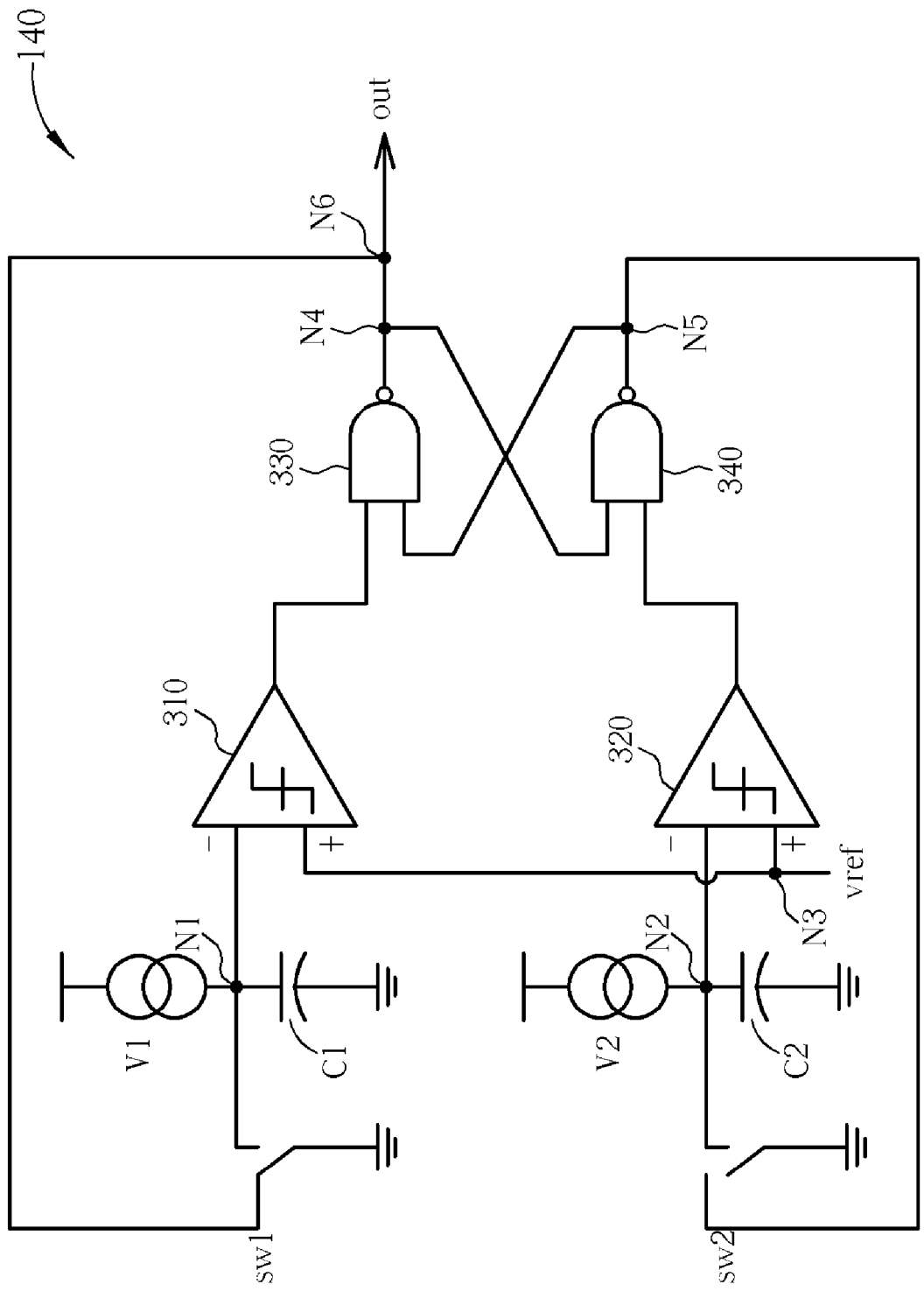
FIG. 3 shows the topology of the relaxation oscillator of FIG. 1.

FIG. 3 shows the topology of the relaxation oscillator 140. The relaxation oscillator 140 comprises two half circuits. Each half circuit has a bandgap over on-chip resistor current to charge the on-chip capacitors in a capacitor bank with the number of capacitors in the capacitor bank currently on-line controlled by the rc_code. Each capacitor bank C1, C2 comprises a plurality of capacitors and resistors that mimic the relationships between the capacitors and resistors in the rccr_combiner 120, allowing the relaxation oscillator 140 to effectively reproduce the effect that the current rc_code has on the rccr_combiner 120. The voltage on the respective capacitor bank is compared to a bandgap based reference voltage. When the voltage stored in the capacitor bank reaches the reference voltage, the comparator output toggles the SR-latch, shuts off the original half circuit, and enables the other half circuit. Hence, the on-chip capacitor banks C1 and C2 are charged and discharged alternatively, and the output of the relaxation oscillator 140 has a time period directly proportional to the on-chip RC time constant rc_code.

The relaxation oscillator 140 comprises a first capacitor bank C1 coupled between ground and a node N1, and the first capacitor bank C1 has an input for receiving the rc_code. The node N1 is coupled to a voltage source V1, a first input of a comparator 310, and is selectively coupled to ground for discharging the capacitor bank C1 via a switch SW1. A second input of the comparator 310 is coupled to a node N3, which in turn is coupled to a bandgap based reference voltage vref. An output of the comparator 310 is coupled to an input of a two input NAND gate 330. The other input of the NAND gate 330 is coupled to a node N5 and the output of the NAND gate 330 is coupled with nodes N4 and N6. Node N6 is coupled to the switch SW1 for controlling the switch SW1 and is also coupled to the first input of the AND gate 150 of the digital calibration module 130 shown in FIG. 1.

The relaxation oscillator 140 further comprises a second capacitor bank C2 coupled between ground and a node N2, and the second capacitor bank C2 also has an input for receiving the rc_code. The node N2 is coupled to a voltage source V2, a first input of a comparator 320, and is selectively coupled to ground for discharging the capacitor bank C2 via a switch SW2. A second input of the comparator 320 is coupled to the bandgap based reference voltage vref via the node N3. An output of the comparator 320 is coupled to an input of a two input NAND gate 340. The other input of the NAND gate 340 is coupled to the node N4. The output of the NAND gate 340 is coupled to the node N5 and to the switch SW2 for controlling the switch SW2.

It can be shown that the calibration error has two main contributions. One is the comparator delay in the relaxation oscillator and the other is the error in end count due to synchronization of start and stop signals. The advantage of this architecture is that these errors can be kept under control by using a low enough relaxation oscillator output frequency and a long enough counting interval. In other words, swift calibration time is traded for precision. By using proper types of resistors and capacitors, the variation does not depend heavily on temperature and voltage, and is mainly process dependent. Therefore, it is possible to do only one calibration at startup and thus long calibration time is not an issue. Higher precision ensures that image rejection is only limited by resolution of the polyphase filter, rather than calibration. With a high required precision, this architecture saves area or circuit complexity compared to a typical architecture using a voltage comparator.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated tuner comprising:
   a quadrature mixer;
   a polyphase filter having a first input and a second input, the first input coupled to an output of the quadrature mixer;
   a relaxation oscillator;
   a digital calibration module having an output coupled to the second input of the polyphase filter and to an input of the relaxation oscillator, and also having an input coupled to an output of the relaxation oscillator;

a two input AND gate having a first input coupled to the input of the digital calibration module;

a counter having an input coupled to an output of the two input AND gate; and a finite state machine having an input coupled to an output of the counter, a first output coupled to the output of the digital calibration module, and a second output coupled to a second input of the two input AND gate.

2. The integrated tuner of claim 1 wherein the relaxation oscillator further comprises:

a first capacitor bank coupled between ground and a first node, and having an input coupled to the input of the relaxation oscillator wherein the first node is coupled to a first voltage source;

a first switch selectively coupling the first node with ground;

a first comparator having a first input coupled to the first node and a second input coupled to a third node wherein the third node is coupled to a reference voltage;

a first NAND gate having a first input coupled to an output of the first comparator, a second input coupled to a fifth node, and an output coupled to a fourth node, to a sixth node, to a control input of the first switch, and to the output of the relaxation oscillator;

a second capacitor bank coupled between ground and a second node, and having an input coupled to the input of the relaxation oscillator wherein the second node is coupled to a second voltage source;

a second switch selectively coupling the second node with ground;

a second comparator having a first input coupled to the second node and a second input coupled to the third node; and a second NAND gate having a first input coupled to an output of the second comparator, a second input coupled to the fourth node, and an output coupled to the fifth node and to a control input of the second switch.

3. The integrated tuner of claim 2 wherein the first capacitor bank and the second capacitor bank each comprise a plurality of capacitors and resistors that mimic a plurality of capacitors and resistors comprised by the polyphase filter.

4. The integrated tuner of claim 3 wherein the digital calibration module further comprises:

a two input AND gate having a first input coupled to the input of the digital calibration module;

a counter having an input coupled to an output of the two input AND gate; and a finite state machine having an input coupled to an output of the counter, a first output coupled to the output of the digital calibration module, and a second output coupled to a second input of the two input AND gate.

* * * * *